United States Patent
Kosugi

(10) Patent No.: US 7,141,813 B2
(45) Date of Patent: Nov. 28, 2006

(54) SURFACE POSITION DETECTION APPARATUS AND METHOD, AND EXPOSURE APPARATUS AND DEVICE MANUFACTURING METHOD USING THE EXPOSURE APPARATUS

(75) Inventor: Yuji Kosugi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/212,689

(22) Filed: Aug. 29, 2005

(65) Prior Publication Data

US 2006/0033055 A1 Feb. 16, 2006

Related U.S. Application Data

(62) Division of application No. 10/372,310, filed on Feb. 25, 2003, now Pat. No. 6,984,838.

(30) Foreign Application Priority Data

Feb. 28, 2002 (JP) .............................. 2002-054651

(51) Int. Cl.
*G01N 21/86* (2006.01)

(52) U.S. Cl. ...................... 250/548; 250/559.3; 355/53

(58) Field of Classification Search ................ 250/548, 250/559.3; 355/53, 55; 356/399–401
See application file for complete search history.

(56) References Cited

U.S. PATENT DOCUMENTS

| | | | | |
|---|---|---|---|---|
| 5,917,580 A | * | 6/1999 | Ebinuma et al. | ............... 355/53 |
| 5,920,398 A | * | 7/1999 | Iwanaga et al. | ............. 356/401 |
| 6,130,751 A | | 10/2000 | Haginiwa et al. | ........... 356/401 |
| 6,426,508 B1 | | 7/2002 | Kosugi et al. | ............... 250/548 |
| 2001/0020687 A1 | | 9/2001 | Yamada et al. | .............. 250/548 |

* cited by examiner

*Primary Examiner*—Stephone B. Allen
(74) *Attorney, Agent, or Firm*—Fitzpatrick, Cella, Harper & Scinto

(57) ABSTRACT

An exposure apparatus for exposing a substrate moving in a scan direction to light directed via an original. The apparatus includes a projection optical system configured to image a pattern of the original on the substrate, a substrate stage configured to hold the substrate and to move, and a detector configured to detect a surface position of the substrate, held and moved in the scan direction at a scan speed by the substrate stage, in a direction parallel to an optical axis of the projection optical system over a detection region preset on the substrate. The apparatus further includes a controller configured to preset the detection region, to change a detection time over which the detector detects a surface position of the substrate based on a change in the scan speed of the substrate stage so that the detector detects a surface position of the substrate over the preset detection region, and to control at least one of a position and a tilt of the substrate stage with respect to the direction parallel to the optical axis based on a detection obtained by the detector.

10 Claims, 16 Drawing Sheets

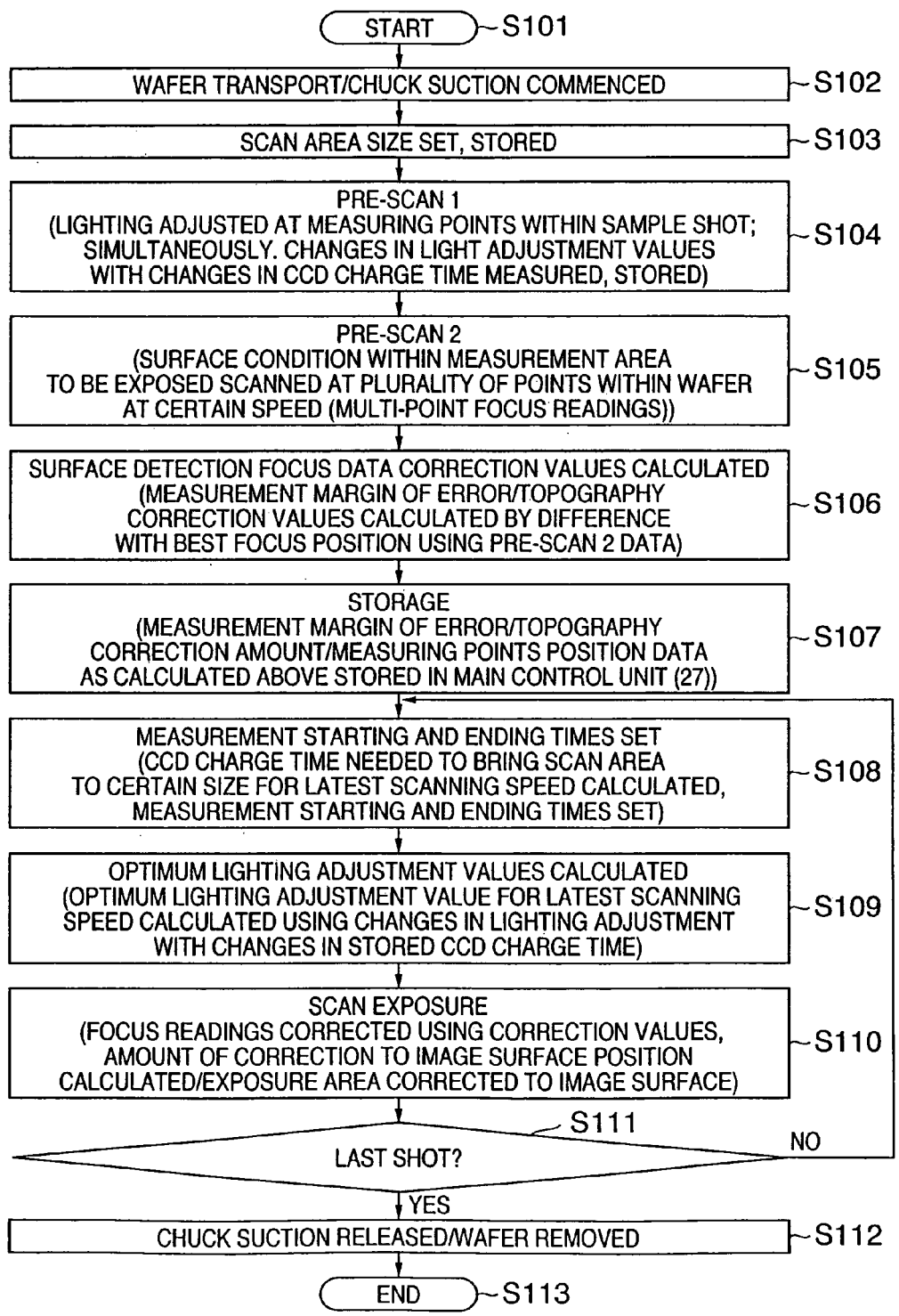

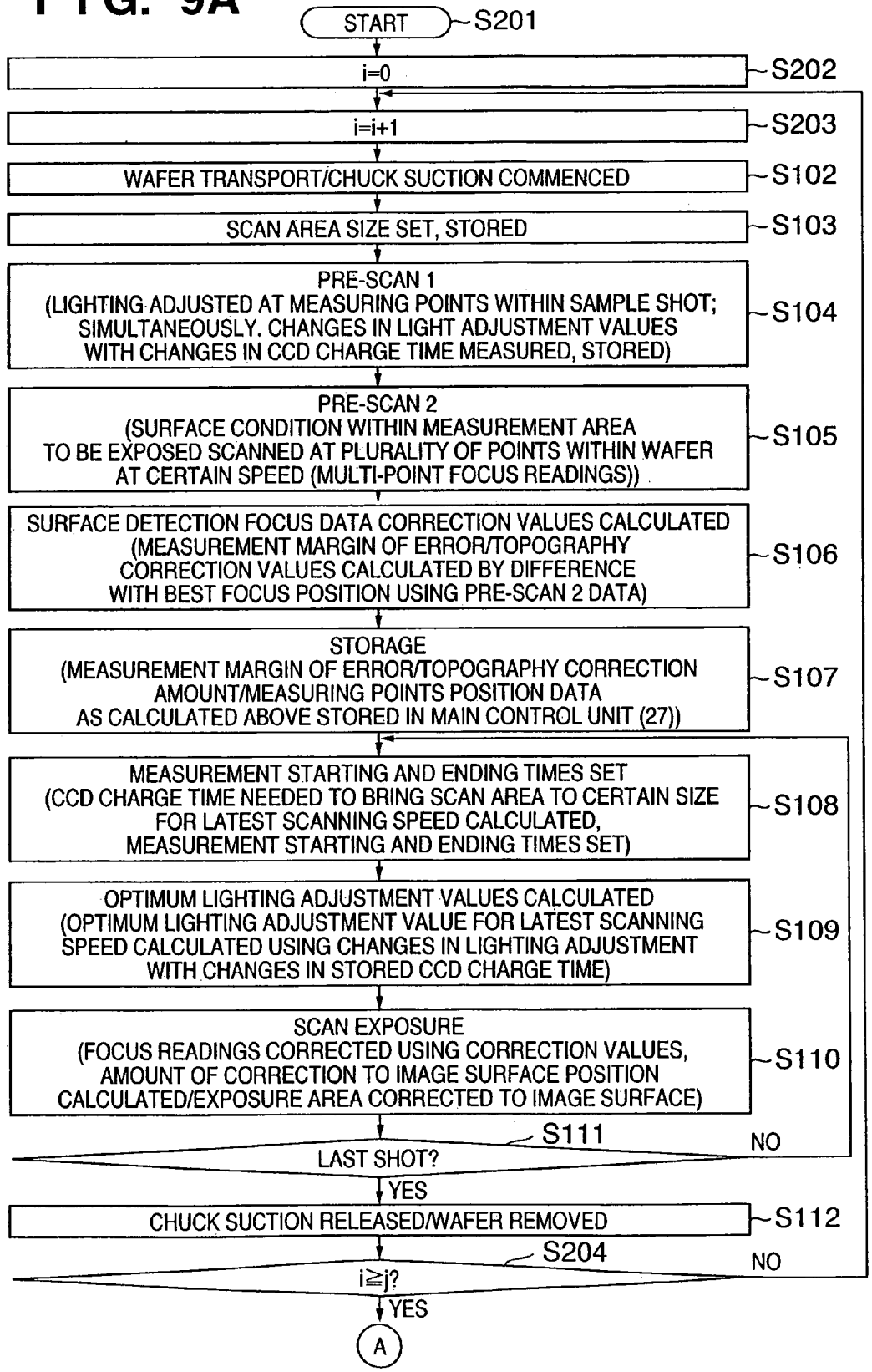

SURFACE POSITION DETECTION APPARATUS AND METHOD, AND EXPOSURE APPARATUS AND DEVICE MANUFACTURING METHOD USING THE EXPOSURE APPARATUS

This application is a divisional application of U.S. patent application Ser. No. 10/372,310, filed Feb. 25, 2003 now U.S. Pat. No. 6,984,838.

FIELD OF THE INVENTION

The present invention relates to a surface position detection apparatus and method, an exposure apparatus and a device manufacturing method using the exposure apparatus, and more particularly, in an exposure apparatus, to a surface position detection apparatus and method adapted to detect a location and a tilt of a surface of a wafer with respect to an optical axis of a projection optical system during an exposure scan.

BACKGROUND OF THE INVENTION

As the density of VLSI circuits has increased, the circuit patterns themselves continue to be miniaturized. This miniaturization of circuit patterns has in turn engendered higher numerical apertures (NA) for the miniaturized projection lens systems used in semiconductor exposure apparatuses, such that the permissible depth of focus of the lens during the process of transferring the circuit pattern has become shallower. At the same time, the area to be exposed by the miniaturized projection lens system during the manufacture of a semiconductor chip has increased. Given these conflicting trends, there is a growing need for a scanner-type semiconductor exposure apparatus capable of enlarging the exposure area and NA while still using a stepper-type lens equivalent.

In a scanner-type exposure apparatus, a common method used to make a good exposure transfer of a circuit pattern across the entire exposure area involves scanning the wafer surface that is to receive the transfer of the circuit pattern on a reticle (hereinafter sometimes referred to as the focus plane of the wafer surface of the miniaturized projection lens system) so as to detect the position and tilt of the wafer surface and continuously adjusting the position and tilt of the focus plane via an auto-focus/auto-leveling correction drive operation so as to continuously present the best possible imaging surface to the projection lens.

There are several commonly known methods of detecting the height of the wafer and the position of the wafer surface (i.e., the position and tilt of the wafer surface described above) in such an arrangement. One commonly known method involves using a detection optical system to direct a beam of light onto the wafer surface at an angle thereto and to detect a positional deviation in the reflected light as a positional deviation on a sensor. Another commonly known method involves using a gap sensor, such as an air microsensor or an electrostatic capacitance sensor, to scan a plurality of points on the surface of the wafer and determine the exact position of the wafer surface from that scan.

Further, in the methods described above, in order to position the entire wafer exposure area (also called a "shot") securely within the permissible depth of focus of the miniaturizing projection lens system—a depth of which, as described above, has become shallower with advances in the NA—the whole process is closely controlled so as to avoid the local topography beneath the point of scanning detection (or of light reflection), which can give erroneous readings, by using a plurality of positions within the shots as detection points, comparing the readings at the detection points against an optimum focus setting surface, measuring the difference (if any), and offsetting it.

Use of this sort of measurement offset is accomplished by one of two methods. The first method involves measuring the measurement offset itself using a pilot wafer to manage the job. The second method involves using the first wafer after a change in the wafer production lot to obtain the measurement offset, which is then used to process that lot.

However, the conventional apparatuses and methods have several problems, which are detailed below.

The scanning speed of a slit-scan-type exposure apparatus is calculated from the apparatus intensity (that is, the illumination intensity within the exposure slit defined by the masking plate) and the wafer surface resist sensitivity so as to yield a best exposure amount.

The intensity of the apparatus can be controlled by the laser output and the laser oscillation frequency, and is set to make the best exposure amount constant in the face of process discrepancies. Here, the term "process discrepancies" means the phenomenon in which the best exposure amount fluctuates within the same wafer due to unevenness in the resist coating on the wafer surface or unevenness in the high-speed dispersion furnaces used in the after-process baking of the wafers (wafer surface oxidation).

The scanning speed and the intensity of the apparatus are interrelated, insofar as, for a given wafer surface resist sensitivity, the scanning speed increases when the laser output and the laser oscillation frequency increase. Conversely, the scanning speed decreases when the laser output and the laser oscillation frequency decrease.

In other words, in the conventional art, a fixed scanning speed can be made constant for the same job or in the same lot by adjusting the best exposure amount using the laser output and the laser oscillation frequency to account for process discrepancies, with the above-described measurement offset obtained for the pilot wafer or the lead wafer in the production used in the processing of that lot.

However, since the scanning speed calculated in such a case becomes the lowest of the speeds among which it is possible to select with respect to the process discrepancies, a problem arises in the throughput. The problem is magnified in the case of DRAMs, which tend to have large individual production lots.

Also, when using low-output laser light source such as Argon-Fluorine (ArF) lasers and $F_2$ lasers, the intensity of the apparatus is insufficient relative to the scanning speed, which is reduced accordingly. As a result, when attempting to control for the best exposure amount using the laser output and the laser oscillation frequency for the process discrepancies, the lack of scanning speed makes improvements in throughput difficult to achieve.

Moreover, even if the scanning speed is increased in order to improve the throughput, the insufficiency of apparatus intensity relative to the scanning speed makes it difficult to control the best exposure amount using the laser output and the laser oscillation frequency in the face of process discrepancies.

One measure used to solve the above-described problem involves controlling the best exposure amount for the process discrepancies by changing the scanning speed with each shot and each wafer, thereby making maximum use of the apparatus intensity. However, the time allotted for the operation of detecting and measuring the position and tilt of the wafer surface while being synchronized with the scanning operation is fixed, so the scan area will vary from shot to shot and wafer to wafer if the scanning speed is changed with each shot and each wafer.

If, in such circumstances, the above-described conventional control method are used to carry out the measurement offset described above, the size of the scan area will be different for the measurement offset and the exposure, leading to an error in the measurement offset for the optimum focus setting surface.

Conversely, seeking the measurement offset for each scanning speed, although it does not lead to errors in the measurement offset for the optimum focus setting surface, does reduce throughput drastically due to the great frequency with which opportunities arise to seek the measurement offset.

SUMMARY OF THE INVENTION

Accordingly, the present invention is proposed in order to solve the above-described problems of the conventional art, and has as its object to provide quick and accurate detection of the position and tilt of a wafer surface using a measurement offset even when the scanning speed is changed with each wafer and each shot.

The above-described object of the present invention is achieved by a surface position detection apparatus comprising:

measuring means for measuring a surface position of a measurement area on the surface of an object;

detection means for detecting the surface position of a measuring point provided on the surface of the object using the measuring means while relatively scanning the surface of the object; and determining means for determining drive parameters of the measuring means according to a speed to be employed in the relative scan of the object surface prior to detection of the surface position with the detection means, such that the measuring area for the measuring point assumes a preset size.

In addition, the above-described object of the present invention is also achieved by a surface position detection method comprising:

a detection step of relatively scanning a surface of an object using measuring means for measuring the surface position of a measurement area on the surface of the object and detecting the surface position of a measuring point provided on the surface of the object; and a determination step for determining drive parameters of the measuring means according to the speed to be employed in the relative scan of the object surface prior to detection of the surface position with the detecting means, such that the measuring area for the measuring point assumes a preset size.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention, in which:

FIG. 8 is a flow chart showing steps in a measurement offset and a surface position correction drive sequence during exposure at the shots using the surface position detection method according to a first embodiment of the present invention;

FIGS. 9A and 9B are flow charts showing steps in a wafer processing sequence using the surface position detection method, according to the first embodiment of the present invention;

DETAILED DESCRIPTION OF THE PREFERRED EMBODIMENTS

Preferred embodiment of the present invention will be described in detail in accordance with the accompanying drawings.

(First Embodiment)

Figure 1:
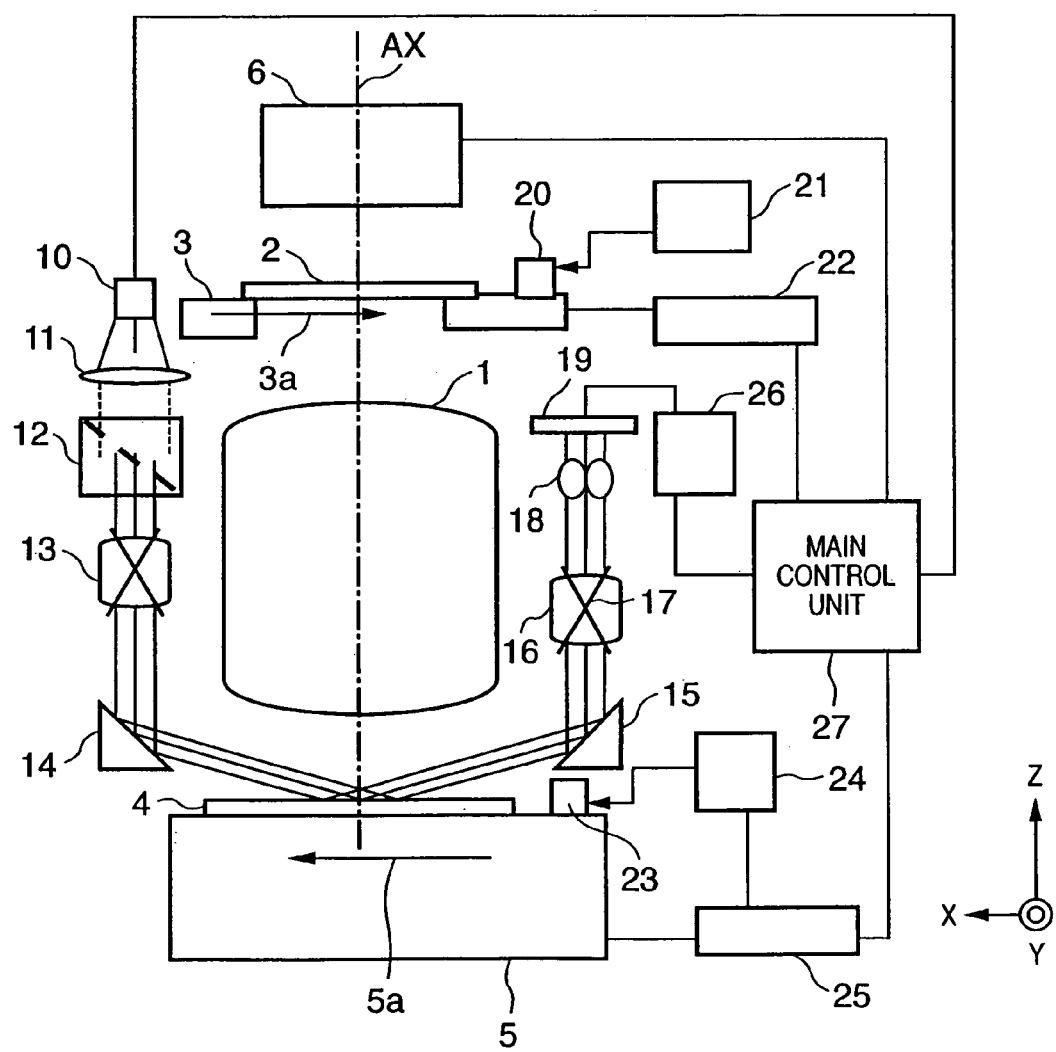
FIG. 1 is a partial schematic diagram illustrating a lateral cross-sectional view of an example of a slit-scanner-type projection exposure apparatus according to one embodiment of the present invention.

FIG. 1 is a partial schematic diagram illustrating a lateral cross-sectional view of an example of a slit-scanner-type projection exposure apparatus according to one embodiment of the present invention.

In FIG. 1, reference numeral 1 denotes a miniaturized projection lens system, in which the dot-and-dash line AX indicates the axis of light. The image surface lies perpendicular to the Z-axis of the diagram. Reference numeral 2 denotes a reticle and reference numeral 3 denotes a reticle stage. The reticle 2 is retained atop the reticle stage 3. A pattern on the reticle is reduced from ¼ to ½ or ⅕ its original size by the scaling of the miniaturized projection lens system and projected onto the image surface, where it forms an image.

Reference numeral 4 denotes a wafer that is coated with a resist, on which a multiplicity of exposure areas (shots) having an identical pattern structure that were formed in the exposure step described above are aligned. Reference numeral 5 denotes a stage on which a wafer is placed, the stage 5 consisting of a chuck that suctionally fixes the wafer 4 to the stage 5, an X-Y stage capable of horizontal movement in the direction of the X axis and the direction of the Y axis, a leveling stage capable of movement in the direction of a Z axis that is the optical axis (AX) of projection lens 1 as well as rotation about the X axis and Y axis, and a rotary stage capable of rotating about the Z axis. All together, the stage 5 forms a six-axis correction system for focusing the reticle pattern image onto the wafer.

Reference numerals 10–19 in FIG. 1 denote various constituent elements of a detection optical system of the surface position detection apparatus, provided in order to detect a surface position and tilt of the wafer. Reference numeral 10 denotes a light source, which consists of an illumination unit configured so as to direct light from either a white lamp or a high-intensity LED having a plurality of different peak wavelengths. Reference numeral 11 denotes a collimator lens, which projects beams of light from the light source 10 as parallel beams of light having a substantially uniform cross-sectional intensity distribution. Reference numeral 12 denotes a prism-like slit member, in which the tilted surfaces of a pair of prisms are glued together, with a plurality of apertures (in the present embodiment, nine pin-holes) provided on the glued-together surfaces using a light shielding membrane. The light shielding membrane may be chrome.

Reference numeral 13 denotes a double side telecentric optical system, in which the nine separate beams of light passing through the plurality of pin-holes in the slit member 12 are directed onto nine different measuring points on the surface of the wafer 4. Although FIG. 1 shows only three of the beams of light, each beam of light has three beams of its own, in a direction perpendicular to the surface of the paper. The plane in which the pin-holes are formed and a plane that includes the surface of the wafer 4 are arranged so as to satisfy Scheinmpflug's condition with respect to the optical system. The projector portion of the surface position detection apparatus includes the parts denoted by the foregoing reference numerals 10–14.

Figure 2:
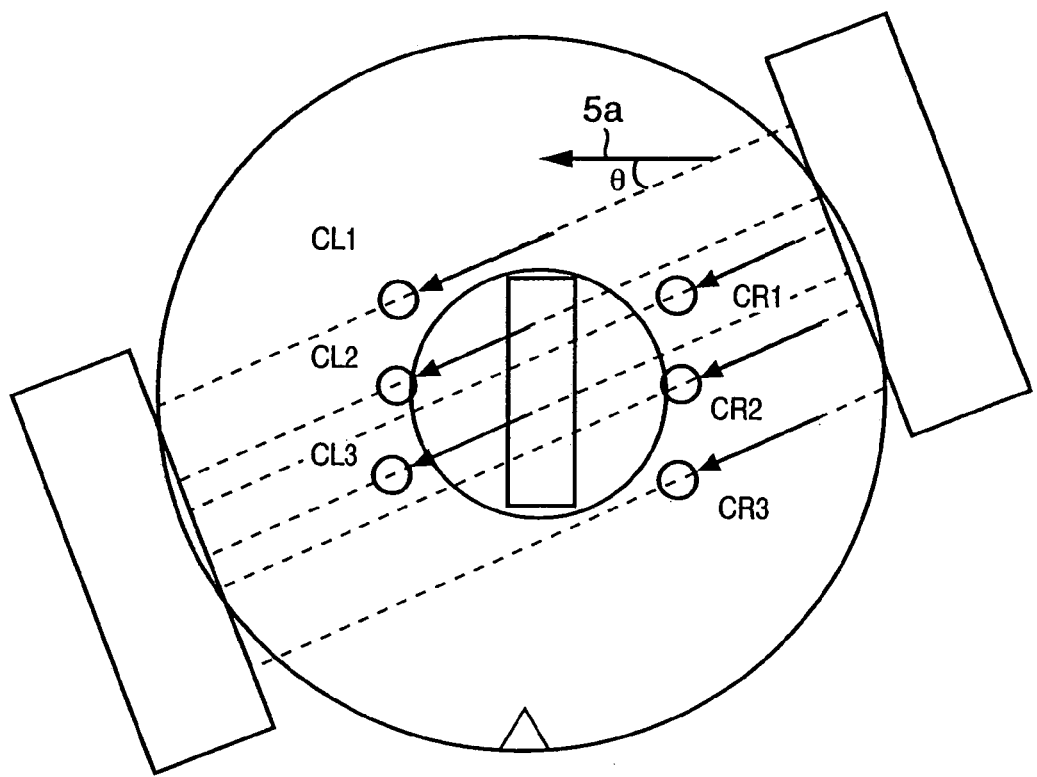
FIG. 2 is a diagram illustrating the positions of the exposure slit and the measuring points during surface position detection using a detection optical system.
Figure 3:
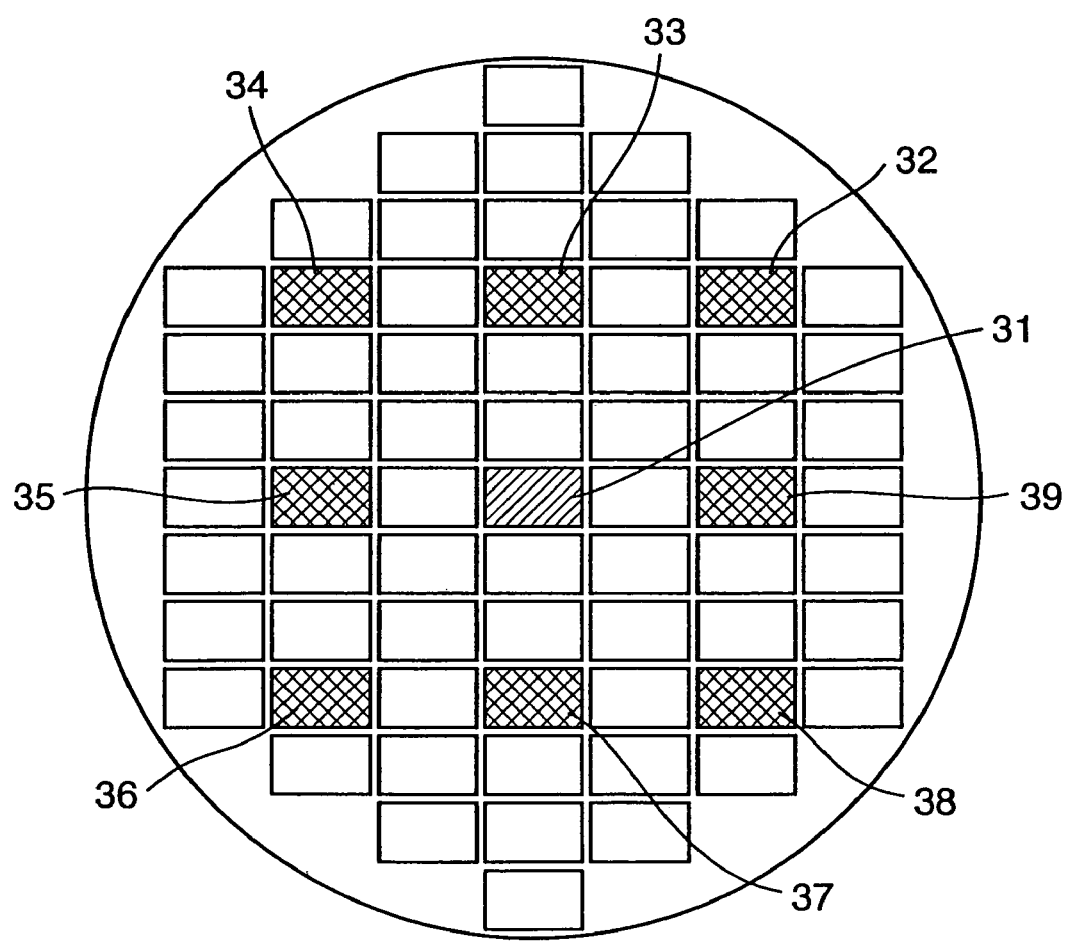
FIG. 3 is a schematic plan view of the disposition of exposure area (shots) and a sample shot selection example using pre-scan light adjustment and measuring the surface state within the exposure area.

FIG. 2 is a diagram illustrating the positions of the exposure slit and the measuring points during surface position detection using a detection optical system. FIG. 3 is a schematic plan view of the disposition of exposure areas (shots) and a sample shot selection example using pre-scan light adjustment and measuring the surface state within the exposure area.

In the present embodiment, the angle of incidence Φ at which the beams of light are directed onto the surface of the wafer 4 from the projector portion (angle between a perpendicular line set up on a wafer surface (optical axis) and beams of light) is at least 70°. As shown in FIG. 3, a plurality of exposure areas (shots) having the same pattern structure is arranged on the surface of the wafer 4 (shown in FIG. 3 as rectangles). The nine beams of light that have passed through the lens system 13 are directed and focused onto mutually independent measuring points of a pattern area like that shown in FIG. 2. (It should be noted that FIG. 2 shows only six of the nine beams of light referred to in the present embodiment, the remaining three beams of light being emitted solely for the sake of simplicity in description.) Also, the nine measuring points are illuminated by the beams of light striking them from a direction rotated away from the X axis (that is, scanning direction 5a) in the X-Y plane by θ° (in this example, 22.5°) so as to be mutually independent and observable.

Returning once more to FIG. 1, a description is given of the detection of the beams of light reflected from the wafer 4, that is, of a sensing part composed of assemblies 15–19.

Reference numeral 16 denotes a sensor optical system of a double side telecentric system, which senses the nine beams of light reflected from the surface of the wafer 4 via a mirror 15. A stopper aperture 17 provided within the sensor optical system 16 is common to all nine measuring points, and cuts out high-diffraction light (that is, noise light) generated by the circuit pattern existing on the wafer 4. The axes of the beams of light that pass through the sensor optical system 16 of the double side telecentric system are mutually parallel and are focused onto a sensor surface of photoelectric converter assembly 19 by nine separate lenses of a correction optical system assembly 18 so as to form nine separate spotlights of identical size.

Parts 16–18 of the sensor described above correct the relative tilt of the measuring points on the surface of the wafer 4 and the sensor surface of the photoelectric converter assembly 19 so that the two are in conjunction. Such tilt correction eliminates fluctuations in the position of the pin-hole image at the sensor surface caused by localized tilting at the measuring points, so that the pin-hole image changes at the sensor surface in response only to changes in the height along the axis of light AX of the measuring points.

In the present embodiment, the photoelectric converter assembly 19 is composed of, for example, nine one-dimensional CCD line sensors. As can be appreciated by those of ordinary skill in the art, however, the same effects of the present invention as described above can be achieved using instead a plurality of two-dimensional position detectors for the photoelectric converter assembly 19.

Next, a description is given of the slit-scan type of exposure system, with reference once again to FIG. 1.

After the reticle 2 shown in FIG. 1 is suctionally attached to the reticle stage 3, the apparatus is correctively driven so as to scan within a plane positioned perpendicular to the axis of light AX of the projection lens 1, in a direction indicated in FIG. 1 by arrow 3a (that is, along the X axis), as well as in a direction perpendicular to arrow 3a (that is, along the Y axis, i.e., in a direction perpendicular to the surface of the paper), at a constant speed, so as constantly to maintain a target coordinate position.

The position of the reticle stage along the X axis and the Y axis is constantly measured by directing a plurality of laser beams onto an XY bar mirror 20 fixedly mounted on the reticle stage as shown in FIG. 1.

An exposure illumination optical system 6 uses a light source that generates pulses of light such as an excimer laser, and is composed of at least a beam alignment optical system, an optical integrator, a collimator and a mirror (none of which is shown in the diagram). These members are made of materials which efficiently transmit or reflect the pulse light of the far ultraviolet region. The beam alignment optical system corrects the cross-sectional shape and dimensions of the emitted beams of light to a desired shape and dimensions. The optical integrator equalizes the distribution of luminous intensity of the beams of light so that the reticle 2 is illuminated with uniform illuminance.

A masking blade inside the exposure illumination optical system 6 that is not shown in the diagram sets a rectangular illumination area according to the chip size. A pattern on the reticle 2 that is partially illuminated by this illumination area is projected by the projection lens 1 onto the wafer 4, which is coated with a resist.

A main control unit 27, shown in FIG. 1, exerts overall control of the apparatus, that is, it both synchronizes the reticle 2 and the wafer 4 with the projection optical system as well as projectively exposes the pattern on the reticle 2 onto the wafer 4 through a reduction projection optical system 1, while adjusting the position of the slit image of the reticle 2 within a particular area of the wafer 4 in the X-Y plane (that is, the X, Y position and the angle of rotation $\omega_z$ around the Z-axis) and along the Z-axis (i.e., the angles of rotation $\omega_x$, $\omega_y$ around the X-axis and the Y-axis, as well as the height along the Z-axis).

More particularly, the alignment or positioning of the pattern on the reticle 2 within the X-Y plane is executed by first obtaining position data readings from a reticle interferometer 21 and a wafer stage interferometer 24, as well as position data on the wafer 4 from an alignment microscope not shown in the diagram. The various position data so obtained is then used to calculate control data with which to control a reticle position control system 22 and a wafer position control system 25.

When scanning the reticle stage 3 in the direction indicated by arrow 3a in FIG. 1, the wafer stage 5 is scanned with a speed that is corrected in the direction of arrow 5a in FIG. 1 by an amount equal to the reduction rate of the projection lens. The scanning speed of the reticle stage 3 is set to achieve the best throughput possible, given the width of the masking blade inside the exposure illumination optical system 6 (not shown in the diagram) in the direction of the scan and the sensitivity of the resist that coats the surface of the wafer 4.

Figure 4A:
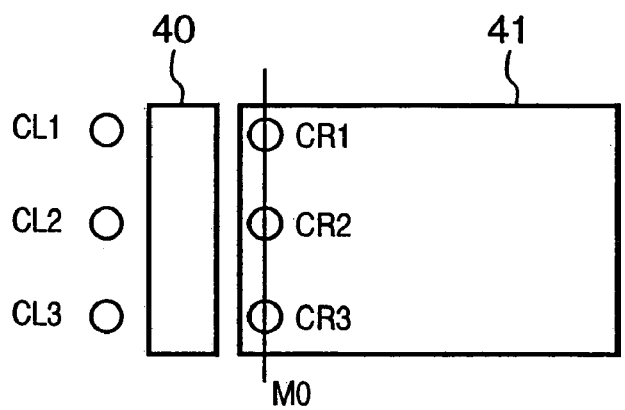
FIGS. 4A–4C are diagrams illustrating the positions of the shot, slit and measuring points (spots) during scanning/measurement.
Figure 4B:
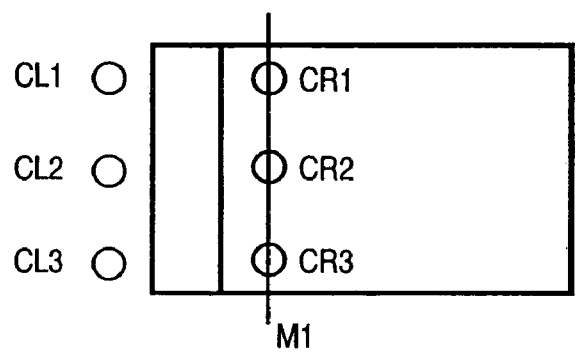
Figure 4C:
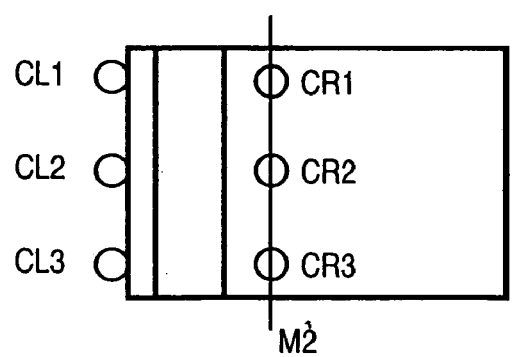

FIGS. 4A–4C are diagrams illustrating the positions of a shot 41, slit 40 and six measuring points (spots) on the wafer 4 during scanning/measurement.

As shown in the diagram, there are three spots on each side of the exposure slit 40 in the scanning direction, with three more slots not shown in the diagram disposed within the exposure slit 40 for a total of nine spots. The spots inside the exposure slit 40 are used for slit acquisition measurement. The height of the wafer (i.e., its location on the Z-axis) is measured at a plurality of measuring points (M0, M1, M2, . . . ) in the scanning direction at each spot, in the three channels composed of spots CR1, CR2 and CR3 when the wafer 4 is scanned from right to left as shown in the diagram (in this case, the slit 40 scans from left to right), and in the three channels composed of spots CL1, CL2 and CL3 when scanning the wafer 4 from left to right.

The measurements so obtained are then further used as data for focus correction when scanning the wafer 4 further proceeds and the measuring points come to the center of the exposure slit 40. In other words, focus correction is performed by pre-reading focus measurements at measuring points ahead of scanning.

Figure 5:
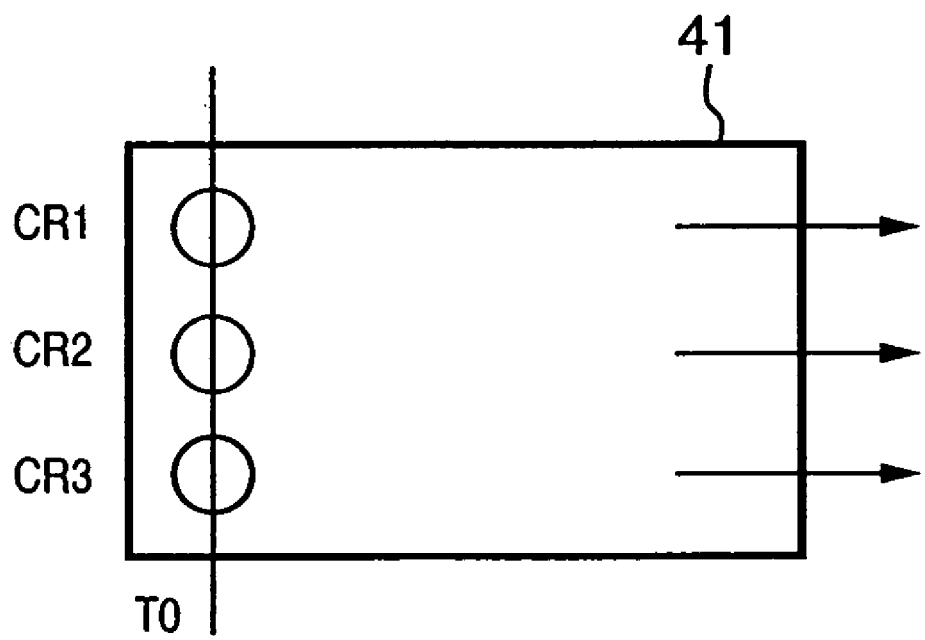
FIG. 5 is a diagram illustrating the positions of the shot and the spot at the beginning of scanning/measurement in the present embodiment.

FIG. 5 is a diagram illustrating the positions of the shot and the spot at the beginning of scanning/measurement, that is, of the spots CR1, CR2 and CR3 at a time T0 in the present embodiment.

Figure 6A:
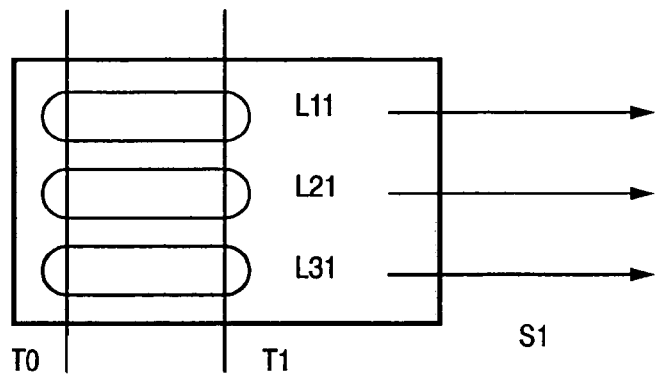
FIGS. 6A and 6B are diagrams showing the change in a measured area due to differences in scanning speed.
Figure 6B:
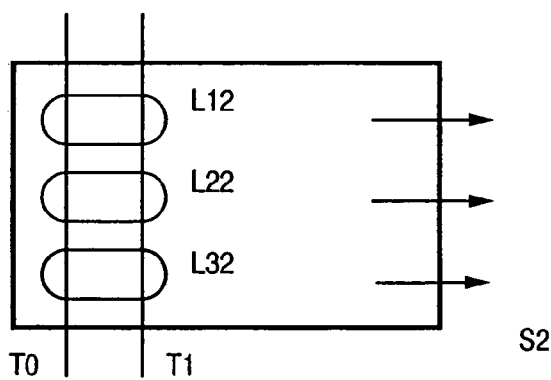

FIGS. 6A and 6B are diagrams showing the change in measured area due to differences in scanning speed, that is, scanned and measured areas L11, L21, L31 and L12, L22, L32 that the spots CR1, CR2 and CR3 scan and measuring during a certain time interval (from T0 to T1) at different scanning speeds S1 and S2. Since the scanning speeds are different (i.e., S1>S2), the measured areas are also different, as shown in the diagram.

Figure 7A:
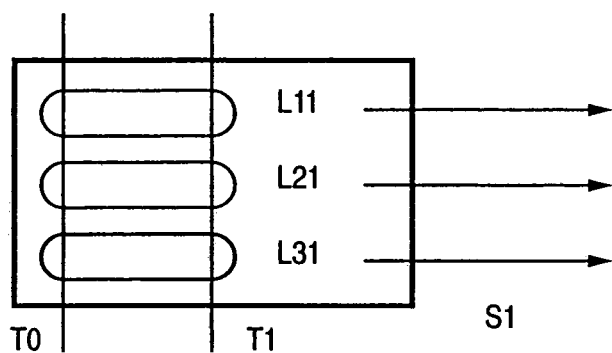
FIGS. 7A and 7B are diagrams illustrating how the difference in measured area due to differences in scanning speed shown in FIGS. 6A and 6B is absorbed by the measurement time interval.
Figure 7B:
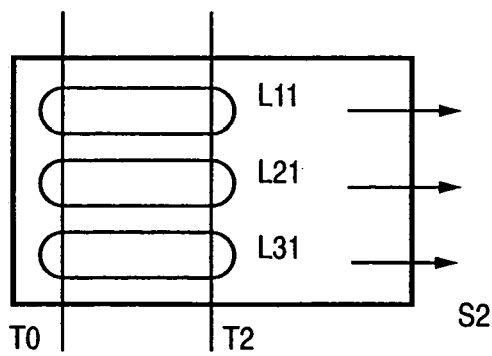

FIGS. 7A and 7B are diagrams illustrating how the difference in measured area due to differences in scanning speed shown in FIGS. 6A and 6B is absorbed by the measurement time interval, that is, how identical positions (that is, measurement areas of the same size at the same position) of the measurement areas to be scanned and measured by the spots CR1, CR2 and CR3 can be maintained by changing the measurement starting time T0 and the measurement ending times T1, T2 in accordance with the scanning speed. As can be readily appreciated by those of ordinary skill in the art, the measurement starting time T0 is recalculated for each shot in accordance with the scanning speed so that the measurement area is always at the same position.

The wafer position control system 25 positions the pattern on the reticle along the Z-axis (that is, aligns it with the image surface) by controlling the leveling stage inside the wafer stage based on calculation results performed by a surface position detection controller 26 for detecting the height of the wafer 4. In other words, the wafer position control system 25 calculates the tilt of the wafer in a direction perpendicular to the scanning direction and its height along the axis of the light AX using height data from the tree spotlights (CF1-3 or CL1-3) disposed near the slit in the scanning direction and used to measure the height of the wafer, determines the amount of correction to the optimum image surface position at the exposure position, and corrects accordingly.

In the exposure apparatus shown in FIG. 1, prior to exposing the wafer, the wafer is pre-scanned at a sample shot (that is, a shot 31 with the diagonal lines shown in FIG. 3) under a constant illuminance by the light source 10 to obtain light adjustment data by sensing the reflected light at the detection points with the photoelectric converter assembly 19. The light adjustment data may be signal peaks, for example. The photoelectric converter assembly 19 may be a CCD sensor. From the data so obtained, the exposure apparatus then calculates and stores the setting current value needed to attain an optimum peak value for focusing during scan exposure at each measuring point. By driving the light source 10 at this setting current during exposure of the shots, the shots can be illuminated at a setting current suitable for the reflectance at successive measuring points, and the shape of the waveform to be measured can be held constant regardless of the reflectance. It should be noted that, instead of adjusting the lighting using the setting current of the light source 10 as described above, the lighting may be adjusted by adjusting the gain at the photoelectric converter assembly 19.

By determining the optimum lighting and gain at the detection points in advance of scanning/measurement as described above enables the lighting to be adjusted quickly and accurately so as to provide a uniform measurement time interval, during scanning/measurement, with the result that the scanning and surface position measurement can be conducted simultaneously, and, accordingly, providing accurate offset correction and precise surface position detection.

Moreover, the above-described exposure apparatus pre-scans measurement offset values for the purpose of correcting differences in focus measurement readings caused by differences in the surface conditions at the detection points, and corrects the measurements at each of the successively obtained measuring points during exposure of each shot.

In order to detect deviations in the position of the exposure area of the wafer 4 on the Z-axis, that is, the position (Z) and tilt ($\omega_x$, $\omega_y$) with respect to the image surface position, the surface of the wafer 4 must be accurately measured and, at the same time, the relation between the illumination area shape and exposure area pattern structure (actual topography) must be carefully considered.

Using an optical detection system to achieve the former goal, that is, the object of accurately measuring the surface of the wafer 4, requires considering the detection margin of error factor caused by the effects of interference between the light reflected from the surface of the resist on the wafer 4 and the light reflected from the surface of the substrate of the wafer 4. These effects vary depending on the material used in the substrate surface that is in a broad sense the pattern structure, and with high-reflection wiring materials such as aluminum, are too large to be ignored. Also, when using an electrostatic capacitance sensor as the wafer surface position detection sensor, and GaAs (gallium-arsenic) wafers are used as the substrate of high-speed elements or light-emitting diodes, as is common knowledge, unlike with silicon wafers, there are large measurement offsets because such wafers are dielectrics.

With the exposure apparatus shown in FIG. 1, obtaining the measurement offset for correcting for differences in focus measurement readings caused by differences in the surface conditions of the individual detection points is accomplished by pre-scanning sample shots 32–39 indicated by cross-hatched markings in FIG. 3. (Here, the term "pre-scanning" means detecting the surface position of a plurality of points inside the exposure area while actually scanning.) Then, the exposure apparatus calculates correction values for correcting the position of the wafer 4 (i.e., the surface position readings indicating the position of the wafer 4) during scan exposure by the distance needed to reach an optimum exposure image surface position (i.e., the margin of error according to the pattern structure) using the surface position detection readings obtained during the scan described above.

It should be noted that the sample shot disposition shown in FIG. 3 is one example, and the number and position of the shots is not limited to that illustrated in FIG. 3.

When calculation of the correction is completed, the position of the wafer is corrected during scan exposure by correcting the surface position detection readings at the detection points that detect the surface position by a correction value corresponding to the pattern structure for those detection points so as to match the area to be exposed to the exposure image surface based on the corrected surface position detection readings.

A description is now given of surface position detection and correction according to a first embodiment of the present invention, with reference to the flow chart of FIG. 8. It should be noted that, in the exposure apparatus of FIG. 1, an LED is used as the light source 10 and a one-dimensional CCD sensor is used as the light sensor.

FIG. 8 is a flow chart showing steps in a measurement offset and a surface position correction drive sequence during exposure at the shots using the surface position detection method according to a first embodiment of the present invention.

When the exposure apparatus receives a start instruction, the process it performs proceeds from a step S101 ("START") to a step S102, in which the wafer is placed on the stage and suctionally mounted on the chuck. In a step S103, based on a certain scanning speed and a certain CCD charge time, a reference scan area size is determined according to the following formula:

Reference scan area size (overall length)=Measurement spot size+(scanning speed×CCD charge time)

and stored in the main control unit 27. It should be noted that the addition of the measurement spot size in the formula above is for the purpose of calculating the overall length of the measurement area size.

Next, in a step S1041, the exposure apparatus adjusts the lighting at a plurality of measuring points inside the area to be exposed while scanning the sample shot 31 of FIG. 3 at a certain speed and stores a signal peak. This adjustment of the lighting while scanning at a certain speed causes the CCD charge time to change in at least two stages, storing at least two or more adjusted lighting results. In other words, the exposure apparatus conducts a plurality of scans during lighting adjustment, changing the CCD charge time with each scan. The operation of adjusting the lighting according to the exposure scanning speed during the exposure scan to be described later is performed using the lighting adjustment data measured and stored as described above.

Next, the exposure apparatus obtains the measurement offset for eliminating the measurement margin of error factor that is itself determined by the pattern structure (that is, by the actual topography within the area to be exposed and the material of the substrate) from the surface position detection readings obtained during exposure scanning. The ultimate amount of that correction includes this measurement offset.

First, in a step S105, in order to measure the shape of the surface within the area to be exposed of the chip (i.e., a plurality of surface positions), the exposure apparatus detects surface position at a plurality of points within the area to be exposed while scanning a plurality of sample shots 32–39, as shown in FIG. 3, at a certain speed. The scanning speed and the CCD charge time are the scanning speed and CCD charge time used in the calculation of the reference scan area size described above. In a step S106, the exposure apparatus calculates correction values for correcting surface position detection readings during the exposure scanning, by a distance required to attain an optimum exposure image surface position (that is, a margin of error depending on the pattern structure) using the surface position detection readings (that is, the surface position data) obtained in the preceding step. In a step S1107, the correction values so calculated are stored in the main control unit 27. More specifically, in step S107, the detection points and the correction amounts are stored as pairs.

In a step S108, the exposure apparatus calculates the optimum CCD charge time based on the exposure scanning speed for the area to be exposed (the scanning speed being previously set in the apparatus according to the client's own specification as to energy requirements, etc.) and the reference scan area size recorded in step S103. Based on the CCD charge time so calculated, the exposure apparatus then sets an appropriate measurement starting time and an appropriate measurement ending time for each of the detection points. In other words, the measurement starting time is the time at which the spot arrives at detection position M0, or the like, and the measurement ending time is the measurement starting time plus the calculated CCD charge time. In addition, in a step S109, from the changes in the light adjustment values with the changes in the CCD charge time stored in step S104, the exposure apparatus determines the optimum light adjustment value for the CCD charge time calculated as described above.

As described above, the present invention makes it possible to set a constant optimum light amount without increasing the time needed to readjust the light even when the scanning speed changes with each exposure area, and at the same time makes it possible to continuously synchronize the measurement areas used for surface position measurement at the detection points. Accordingly, offset control of the focus measurement values can be conducted with a high degree of accuracy in the offset correction of the focus measurement values because the detection points continuously maintain the identical positions, enabling high-resolution pattern transfers with high throughput.

In a step S110, the exposure apparatus scans with the light adjustment values set in step S109. The surface position detection readings taken from the measurement starting time to the measurement ending time set in step S108 at the detection points that detect the surface positions during such scan exposure are corrected by the correction values corresponding to the pattern structures of the detection points (that is, the correction values that were stored in step S107). Based on these corrected surface position detection readings, the area to be exposed is matched to the exposure image surface and exposed. Steps S108 and S109 are executed for each shot.

The light adjustment data and correction values obtained in the pre-scan measurement operation steps S103 through S107 depend on the pattern structure (i.e., the actual topography within the area to be exposed and the material of the substrate). Therefore, wafers of the same lot or having completed the same process probably have the same pattern structure, so it is possible to use the light adjustment data and correction values obtained for at least one wafer for succeeding wafers as well. A description of this type of process is given with reference to FIGS. 9A and 9B.

Figure 9B:
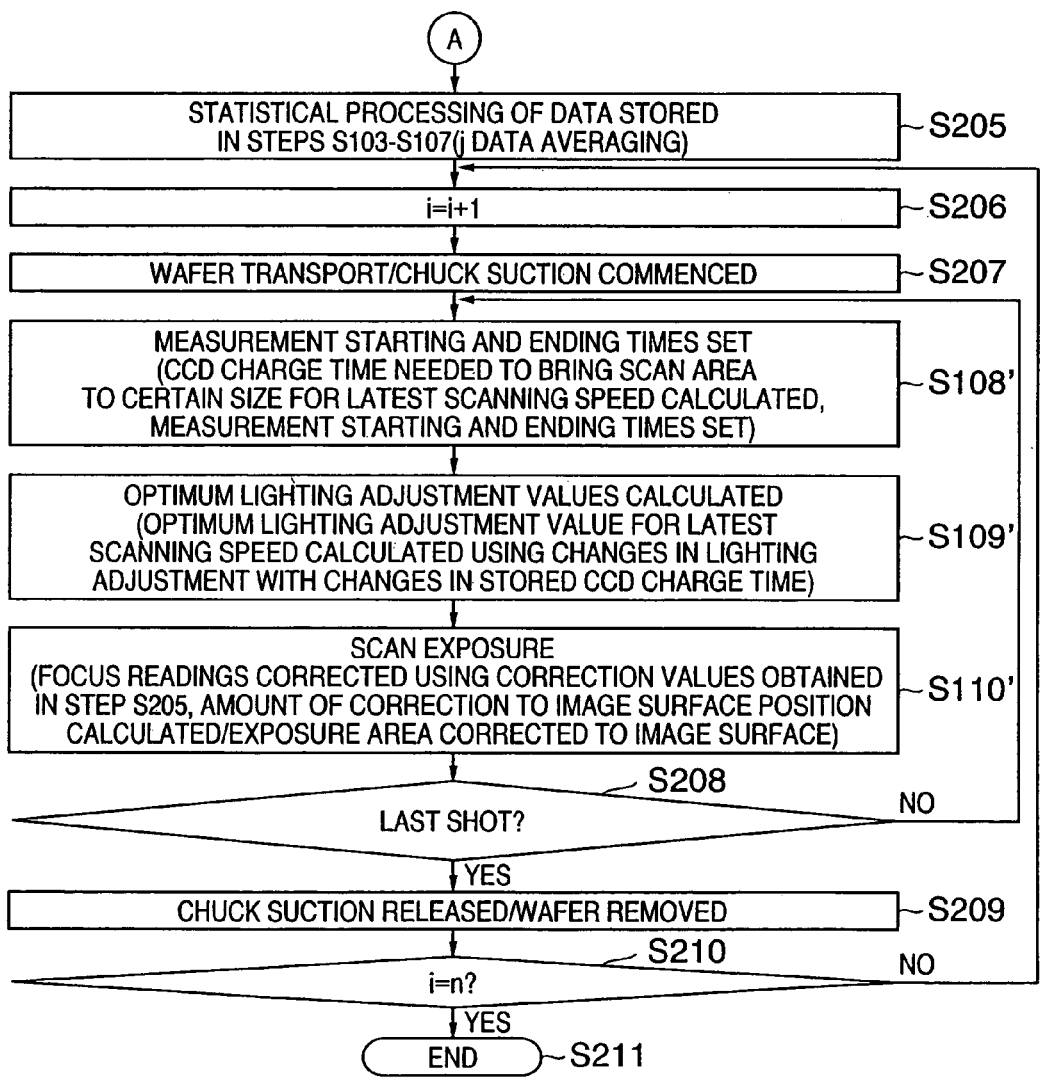

FIGS. 9A and 9B are flow charts showing steps in a wafer processing sequence using the surface position detection method according to the first embodiment of the present invention, that is, a process of pre-scanning a certain number of initial wafers and using the readings thereby obtained to expose succeeding wafers.

In the flow charts shown in FIGS. 9A and 9B, the exposure apparatus performs exposure and pre-scanning for the initial j wafers among the n wafers to be processed. In other words, using a counter i set to 0 in a step S202, steps S102 through S112 are repeatedly executed until the counter i becomes j or more.

When processing of a j number of wafers is completed, the exposure apparatus statistically processes (e.g., averages) the pre-scan data obtained for the j wafers in a step S205 and sets the processed pre-scan data to be applied to the remaining wafers. Then, in steps S206 and the steps that follow, the rest of the wafers are exposed using the processed pre-scan data obtained in step S205.

In other words, in step S206, the exposure apparatus increases the counter by 1 and conveys the next wafer to the wafer stage and chucks it thereat in a step S207. In steps S108' through S110', the exposure apparatus performs the same processes as in steps S108–110 described above, but the pre-scan data to be used were set in step S205. When all the shots on the wafer have been exposed in a step S208, the chuck is released and the wafer is carried out in a step S209. The processes from step S206 to step S209 are executed for all the remaining wafers (in a step S210).

A sequence like that of the flow charts shown in FIGS. 9A and 9B can provide large improvements in throughput.

Second Embodiment

In a second embodiment of the present invention, regarding the exposure apparatus shown in FIG. 1, an LED is used as the light source 10 and a PSD sensor capable of high-speed sampling is used as the sensor. That is, the second embodiment uses a time averaging type sensor that averages a plurality of measurement readings taken in continuous succession to arrive at a single measurement reading.

Figure 10:
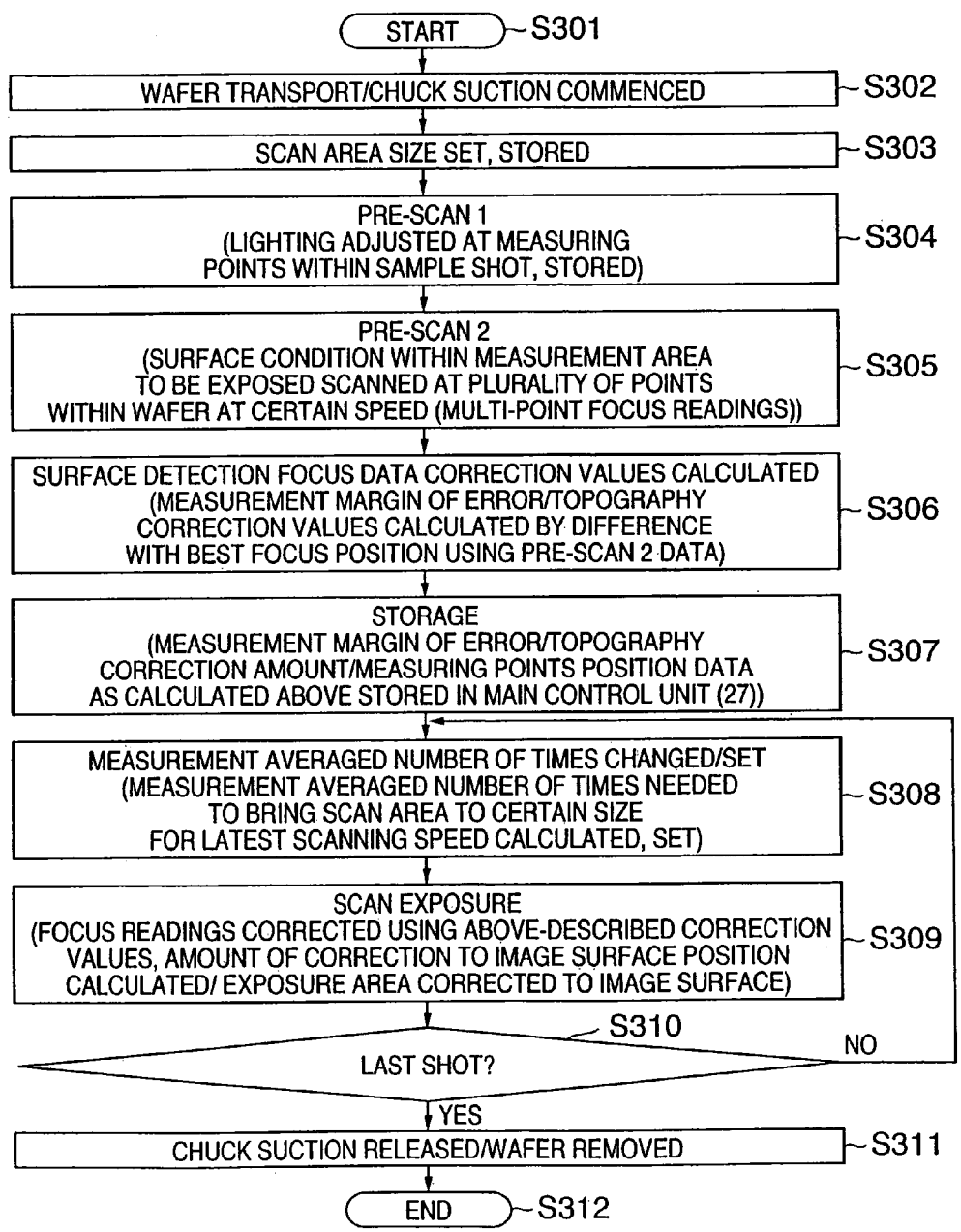
FIG. 10 is a flow chart showing steps in a measurement offset and a surface position correction drive sequence during exposure at the shots using the surface position detection method according to a second embodiment of the present invention.

FIG. 10 is a flow chart showing an exposure processing according to the second embodiment. FIG. 10 shows steps in a measurement offset and a surface position correction drive sequence during exposure at the shots using a surface position detection method according to a second embodiment of the present invention.

When the exposure apparatus receives a start instruction, the process it performs proceeds from a step S301 ("START") to a step S302, in which the wafer is placed on the stage and suctionally mounted on the chuck.

Next, in step S303, the exposure apparatus uses a certain scanning speed and a certain averaged number of times, as well as a sampling clock [Hz] of the PSD sensor, to determine a reference scan area size according to the following formula:

Reference scan area size (overall length)=Measurement spot size+(scanning speed×(averaged number of times/sampling clock))

with the result being stored in the main control unit 27.

In a step S304, the exposure apparatus adjusts the lighting and stores the results thereof at the plurality of measuring points inside the area to be exposed as shown in FIG. 5 while scanning the sample shot area 31 of FIG. 3 at a certain speed. As with the first embodiment described above, this adjustment of the lighting while scanning at a certain speed optimizes the amount of light and the gain. As in the first embodiment as well, the exposure apparatus according to the second embodiment executes a plurality of scans at different averaged number of times in order to accommodate a variety of scanning speeds.

Next, the process proceeds to a step S305, in which the exposure apparatus obtains the measurement offset for eliminating the measurement margin of an error factor that is itself determined by the pattern structure (that is, by the actual topography within the measurement area to be exposed and the material of the substrate) from the surface position detection readings obtained during exposure scanning. The ultimate amount of that correction includes this measurement offset.

First, in step S305, in order to measure the shape of the surface within the area to be exposed of the chip (i.e., a plurality of surface positions), the exposure apparatus detects surface positions at a plurality of points within the area to be exposed while scanning a plurality of sample shots 32–39, as shown in FIG. 3, at a certain speed. At this time, the scanning speed and the averaged number of times are the scanning speed and the averaged number of times used to calculate the reference scan area size described above. Then, in a step S306, the exposure apparatus calculates correction values for correcting the surface position detection readings measured during exposure scan, by a distance required to attain an optimum exposure image surface position (that is, the margin of error according to the pattern structure) using the surface position detection readings (that is, the surface position data) obtained in the preceding step. In a step S307, the correction values so calculated are stored in the main control unit 27.

In a step S308, the exposure apparatus calculates and sets the measurement starting time for the scanning speed and the optimum averaged number of times based on the scanning speed for the area to be exposed and the reference scan area size recorded in step S303. Based on the lighting adjustment data recorded in step S304, the exposure apparatus determines the appropriate setting current and/or gain for the set averaged number of times. It should be noted that, with step S108 described above with respect to the first embodiment, the times at which the measuring points M0 . . . , etc., arrive at the spots are calculated from the scanning speed and measurement starting is set accordingly.

While the exposure apparatus scans the chip in a step S309, the exposure apparatus measures the surface positions at the detection points that detect the surface positions using the measuring starting time and the averaged number of times determined in step S308.

The exposure apparatus then corrects the surface position measurement readings obtained during this exposure using the correction values set for the pattern structure at the detection points (that is, the correction values set in step S307). Based on these corrected surface position detection readings, the area to be exposed is matched to the exposure image surface and exposed.

The light adjustment data and correction values obtained in the pre-scan measurement operation of steps S303 through S306 depend on the pattern structure (i.e., the actual topography within the area to be exposed and the material of the substrate). Therefore, wafers of the same lot or having completed the same process probably have the same pattern structure, so it is possible to use the light adjustment data and correction values obtained for at least one wafer for succeeding wafers as well. As can be readily appreciated by those of ordinary skill in the art, such an arrangement can provide large improvements in throughput. The specific processes involved in such a routine are exactly the same as those described with reference to FIGS. 9A and 9B of the first embodiment, so a description thereof is omitted.

Third Embodiment

Whereas a PSD sensor was used in the second embodiment, it should be understood that the present invention is not limited to such an arrangement. Rather, time-average sensors, such as air micro-sensors and electrostatic capacitance sensors, may be employed instead, with the result that high-accuracy, high throughput can still be achieved even with the use of such non-optical sensors. Accordingly, a third embodiment of the present invention is described with reference to one such non-optical sensor, i.e., an electrostatic capacitance sensor.

Figure 11:
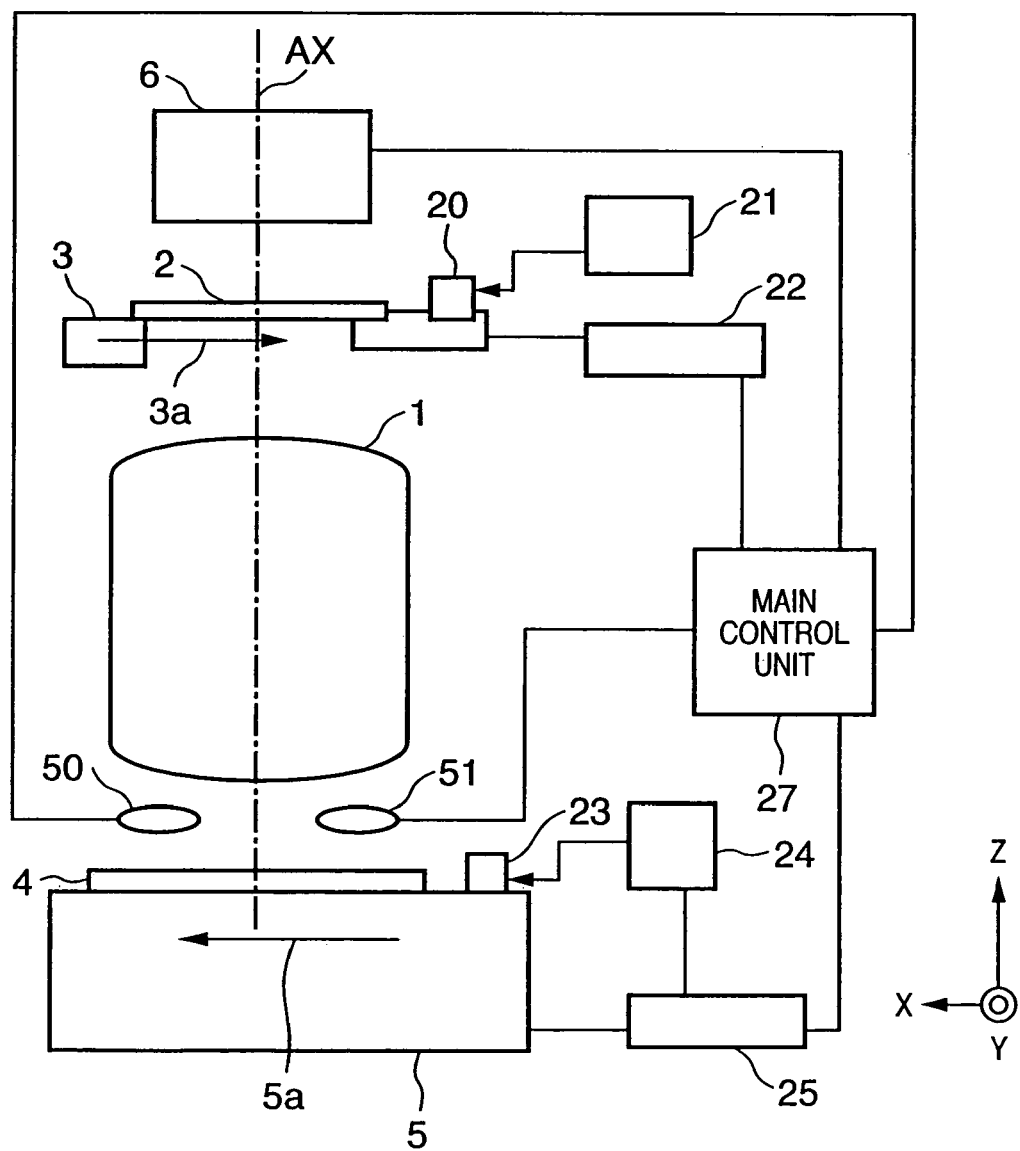
FIG. 11 is a partial schematic diagram showing an example of a slit-scan-type projection exposure apparatus using an electrostatic capacitance in surface position detection.

FIG. 11 is a partial schematic diagram showing an example of a slit-and-scan type projection exposure apparatus using an electrostatic capacitance sensor in surface position detection. Parts that are the same as or similar to parts shown in FIG. 1 are designated with the same reference characters.

In FIG. 11, reference numerals 50 and 51 denote electrostatic condenser sensors provided in order to detect the surface position and tilt of the wafer 4, with three sensors disposed at each of the proximal and distal ends of the scanning direction vis-à-vis the exposure slit, in a direction perpendicular to the surface of the sheet of paper on which the drawing appears. Accordingly, the measuring points consist of the six points CL1–CL3 and CR1–CR3 shown in FIG. 4, positioned with respect to the exposure slit as shown in FIGS. 4A, 4B and 4C.

Figure 12:
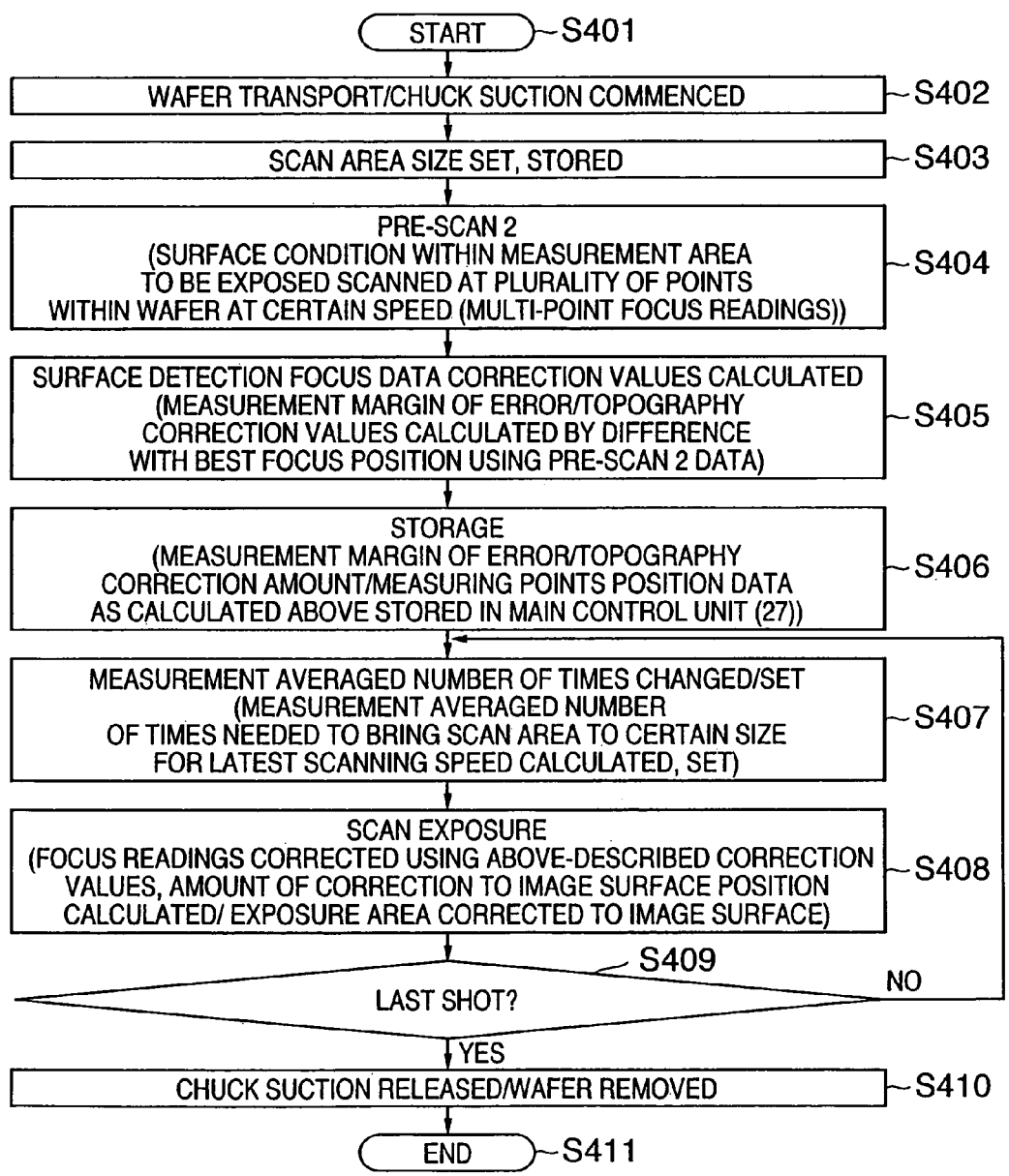
FIG. 12 is a flow chart showing steps in a measurement offset and a surface position correction drive sequence during exposure at the shots using the surface position detection method according to a third embodiment of the present invention.

FIG. 12 is a flow chart showing steps in a measurement offset and a surface position correction drive sequence during exposure at the shots using the surface position detection method according to a third embodiment of the present invention.

As shown in FIG. 12, when the exposure apparatus receives a start instruction, the process it performs proceeds from a step S401 ("START") to a step S402, in which the wafer is placed on the stage and suctionally mounted on the chuck.

Next, in a step S403, the exposure apparatuses uses a certain scanning speed and a certain averaged number of times, as well as a sampling clock [Hz] of the electrostatic capacitance sensor, to determine a reference scan area size according to the following formula:

Reference scan area size (overall length)=Measurement spot size+(scanning speed×(averaged number of times/sampling clock))

with the result being stored in the main control unit 27.

It should be noted that the surface position and tilt detection readings obtained by the electrostatic capacitance sensor use the average reading over a certain number of measurements for enhanced accuracy. However, it is also possible to use the average value over a certain time interval as well, in which case the formula to be used is as follows:

Reference scan area size=Measurement spot size+ (scanning speed×(averaged time/sampling clock)).

Next, the exposure apparatus measures the measurement offsets (correction values) to be used to eliminate the measurement margin of error factor that is itself determined by the pattern structure (that is, by the actual topography within the measurement area to be exposed and the material of the substrate) from the surface position detection readings obtained during the exposure scan.

First, in a step S404, in order to measure the shape of the surface within the area to be exposed of the chip (i.e., a plurality of surface positions), the exposure apparatus uses the electrostatic capacitance sensors to detect surface positions at a plurality of points within the areas to be exposed while scanning a plurality of sample shots 32–39, as shown in FIG. 3, at a certain speed. At this time, the scanning speed and the averaged number of times are the scanning speed and the averaged number of times used to calculate the reference scan area size described above.

Next, in a step S405, the exposure apparatus calculates correction values for correcting the scan exposure surface position detection readings by a distance required to attain an optimum exposure image surface position (that is, the margin of error according to the pattern structure) using the surface position detection readings (that is, the surface position data) obtained in the preceding step S404. In a step S406, the correction values so calculated are stored in the main control unit 27.

Having acquired the pre-scan data as described above, the process proceeds to a step S407, in which the exposure apparatus calculates and sets the measurement starting time for the scanning speed and the optimum averaged number of times based on the scanning speed for the areas to be exposed and the reference scan area size recorded in step S403. (As with step S108 described above, the time at which the measuring points M0 . . . , etc., arrive at the spots is calculated from the scanning speed and the measurement starting time is set accordingly.)

In a step S408, the exposure apparatus scans the chip. During the exposure scanning, the exposure apparatus corrects the surface position detection readings taken from the measurement starting time to the averaged scan completion set in step S407 using the electrostatic capacitance sensors at the detection points, by the above-described correction values corresponding to the pattern structures at the detection points. Based on these corrected surface position detection readings, the measurement areas to be exposed are matched with the exposure image surface and exposed.

The corrected readings obtained during the pre-scan operation described in steps S403 through S405 depend on the pattern structure (that is, by the actual topography within the measurement area to be exposed and the material of the substrate). Therefore, wafers of the same lot or having completed the same process probably have the same pattern structure, so it is possible to use the light adjustment data and correction values obtained for at least one wafer for succeeding wafers as well. As can be readily appreciated by those of ordinary skill in the art, such an arrangement can provide large improvements in throughput. The specific processes involved in such a routine follow those described with reference to FIGS. 9A and 9B of the first embodiment, and can be understood by those of ordinary skill in the art, so a description thereof is omitted.

It should be noted that, as noted previously, instead of changing the averaged number of times in conjunction with the scanning speed, it is possible to change the averaged time in conjunction with the scanning speed instead and still achieve the same effect.

Fourth Embodiment

In the embodiments described above, the scan area is determined using a certain scanning speed and CCD charge time, and the like. By contrast, a fourth embodiment of the present invention shows an example in which the reference scan area size is set from an external input terminal (i.e., a console) not shown in FIG. 1.

Figure 13:
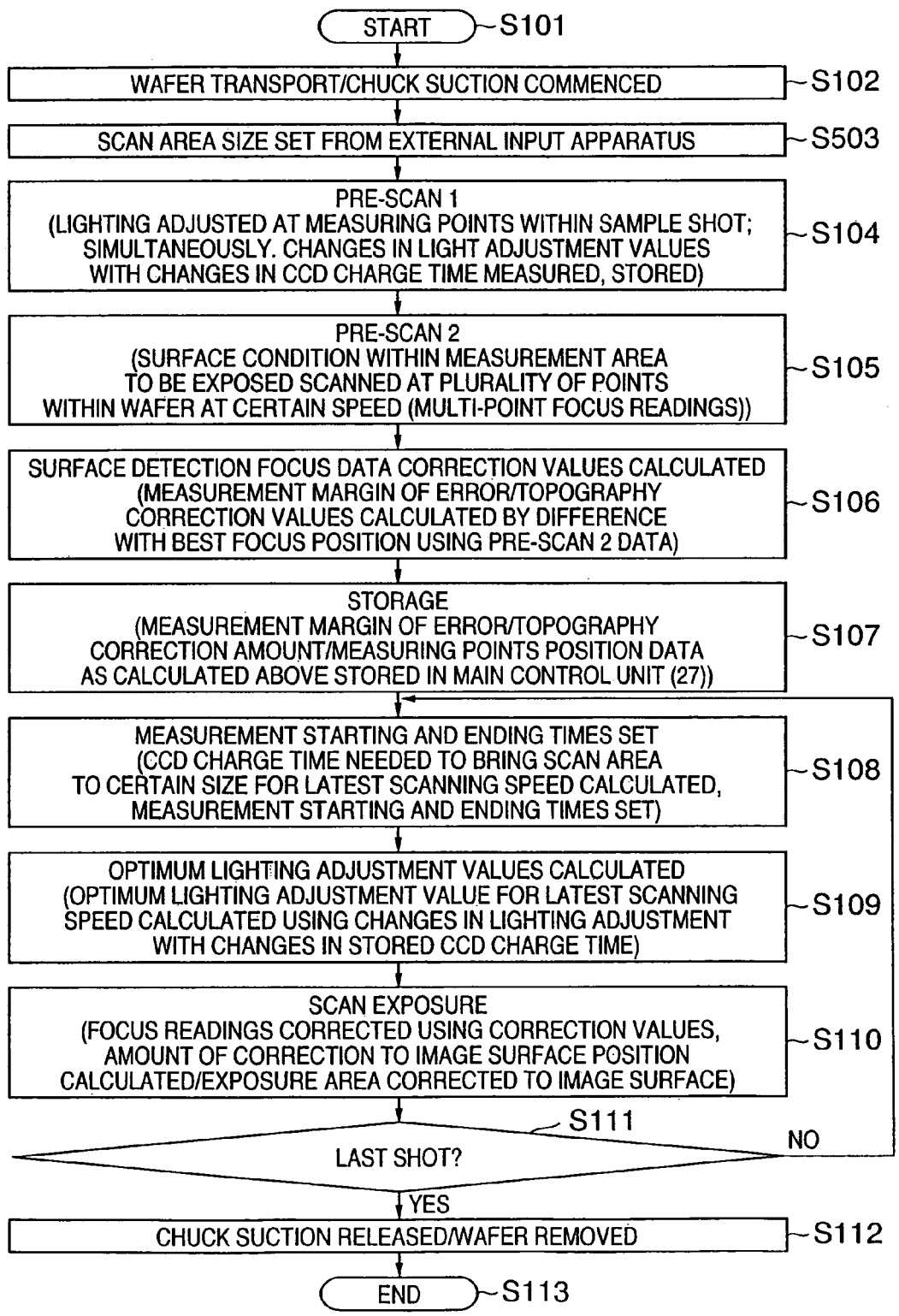
FIG. 13 is a flow chart illustrating the surface position detection method according to a fourth embodiment of the present invention.

FIG. 13 is a flow chart illustrating the surface position detection method according to a fourth embodiment of the present invention. The difference between the embodiment in FIG. 13 and that in FIG. 1 is that the former includes, in step S503, the setting of the size of the scan area using an external input apparatus.

As a result of this use of an external input apparatus to set the size of the scan area, the size of the scan area can be freely selected or specified using the graphic display on the console, making it possible to provide highly reliable measurement area focus for a known shot pattern.

As described above, according to the foregoing embodiments of the present invention, the measuring points are maintained at the same position regardless of changes in scanning speed and changes in exposure illuminance with each wafer and/or each shot, thus eliminating the need to reset the measurement offset with no risk of deterioration in the accuracy of the measurement offset. Accordingly, if the scan speed is changed by selecting an optimum scan speed in accordance with fluctuations of exposure illuminance due to fluctuations of resist sensitivity within a wafer, high accuracy offset correction to focus measurements can be performed, and the surface position detection can be performed with high throughput.

(Fifth Embodiment)

A description is now given of a fifth embodiment of the present invention, that is, of a method for manufacturing semiconductor devices using the exposure apparatus described above.

Figure 14:
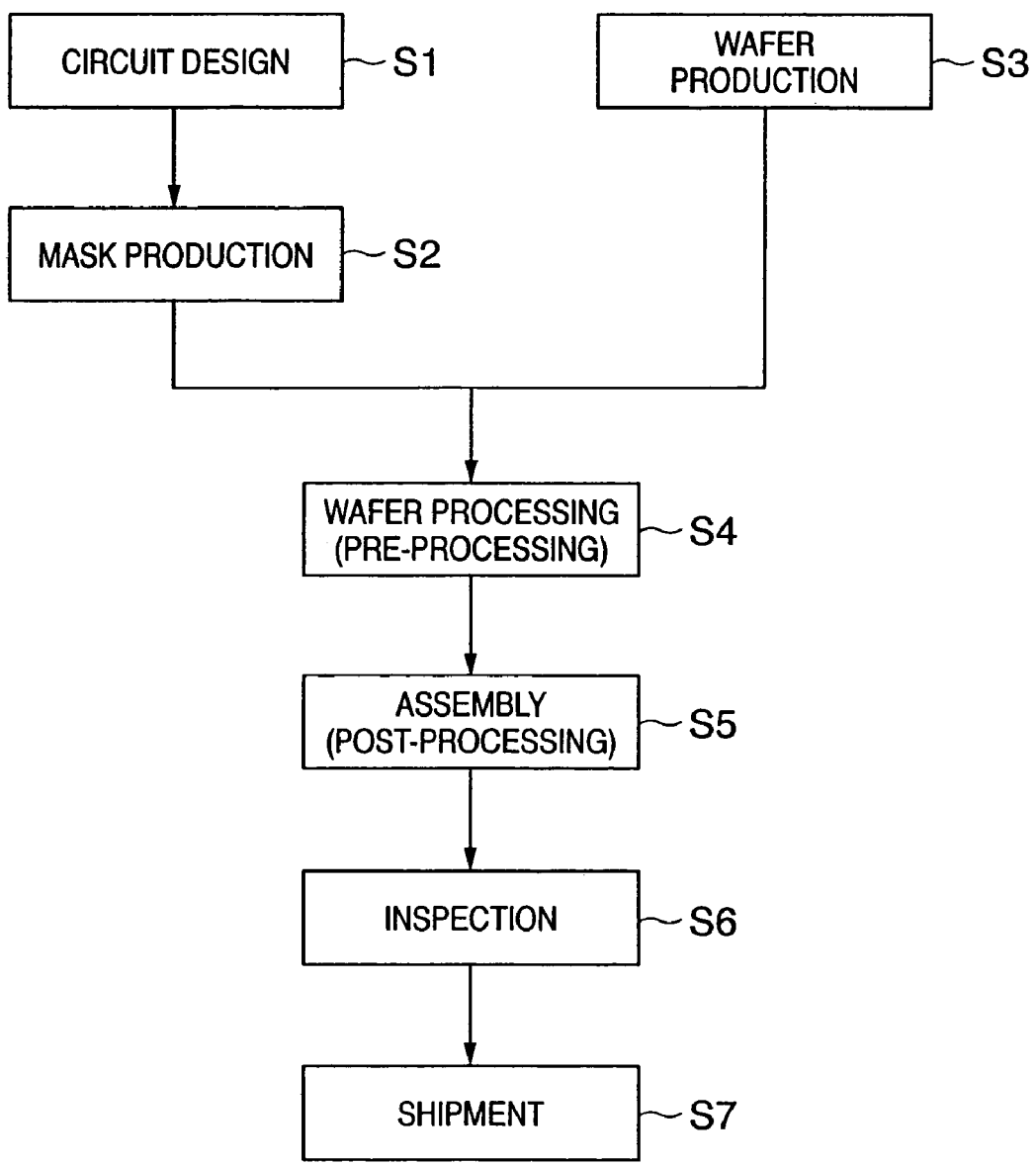
FIG. 14 is a flow chart showing steps in the process for manufacturing a semiconductor device.

FIG. 14 is a flow chart showing steps in the process of manufacturing a miniature semiconductor device.

In a step S1 (circuit design), the circuit is designed. In a step S2 (mask production), a mask is produced on which the designed circuit pattern is formed. In a step S3 (wafer production), a wafer is produced using a material such as silicon. In a step S4 (wafer process), called a pre-process, an actual circuit is formed by lithography using the mask and wafer. Next, a step S5 (assembly), called a post-process, is the process of making a semiconductor chip using the wafer produced in step S4, and includes assembly (dicing, bonding, etc.), packaging (chip insertion), and so on. In a step S6 (inspection), the operation and durability of the semiconductor device produced in step S5 are tested. The completed and tested semiconductor device is then shipped in a step S7, completing the production process.

Figure 15:
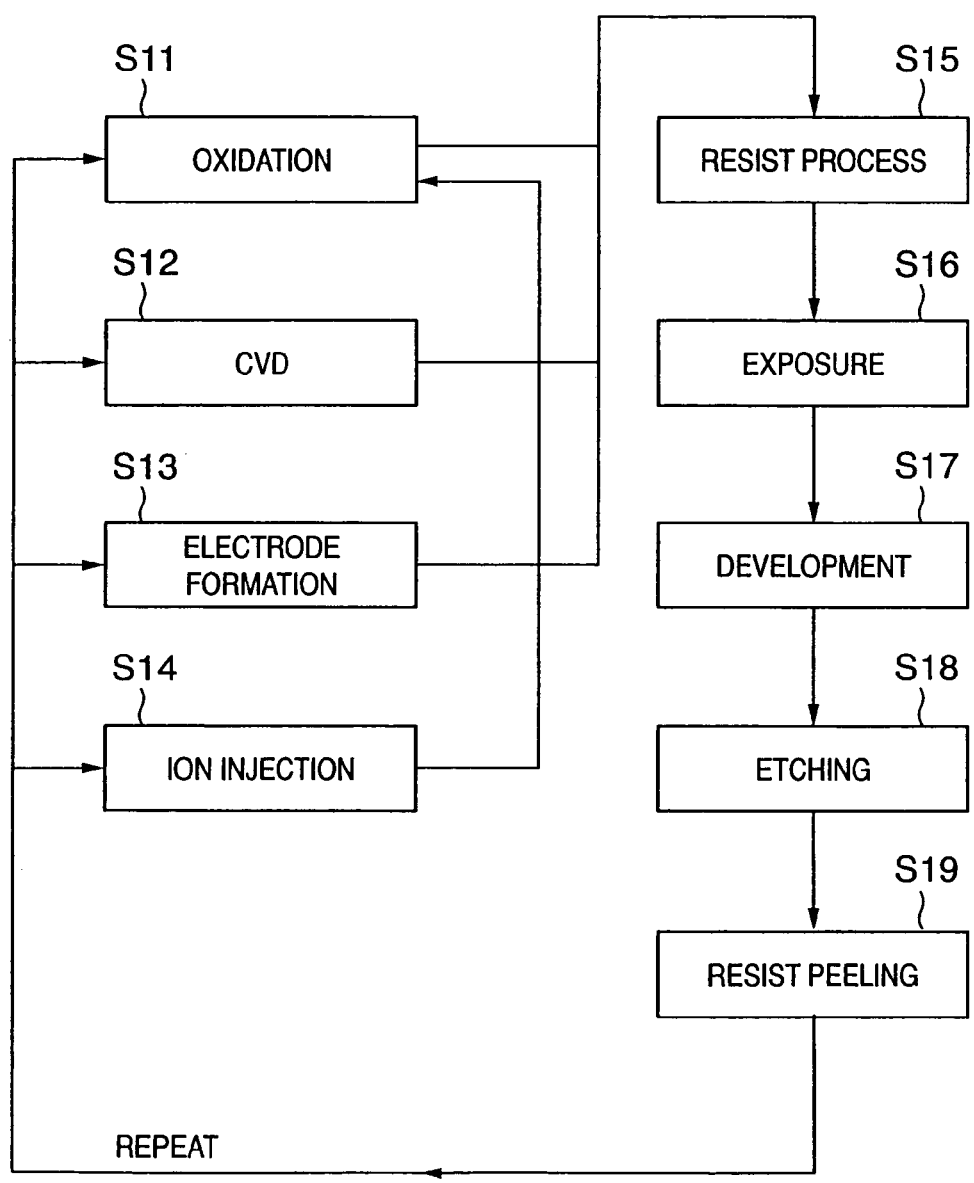
FIG. 15 is a flow chart showing details of the wafer processing operation.

FIG. 15 is a flow chart showing details of the wafer processing operation. In a step S11 (oxidation), the surface of the wafer is oxidized. In a step S12 (CVD), an insulating film is laid down over the surface of the wafer. In a step S13 (electrode formation), electrodes are vapor-formed on the wafer. In a step S14 (ion injection), the wafer is injected with ions. In a step S15 (resist process), the wafer is coated with a photosensitizer. In a step S16 (exposure), a circuit pattern is etched (exposed) on the surface of the wafer using the exposure apparatus described above. In a step S17 (development), the exposed wafer is developed. In a step S18 (etching), everything but the developed resist image is scraped away. In a step S19 (resist peeling), the resist, which is no longer needed now that etching is completed, is removed. By repeating these steps, a multi-layered circuit pattern is formed on the wafer.

By using the exposure apparatus described in the first through fourth embodiments above in the method of manufacturing of the fifth embodiment as described above, surface position detection and measurement using measurement offsets can be performed accurately, thus improving throughput.

As described above, the present invention makes it possible to detect surface positions with a high degree of accuracy using measurement offsets even when the scanning speed is changed with each wafer and each shot. Also, according to the present invention, it is possible to utilize the illuminance of the exposure apparatus to the fullest, and to achieve high throughput.

The present invention is not limited to the above embodiments, and various changes and modifications can be made within the spirit and scope of the present invention. Therefore, to apprise the public of the scope of the present invention, the following claims are made.

What is claimed is:

1. An exposure apparatus for exposing a substrate, moving in a scan direction, to light via a reticle, said apparatus comprising:

a projection optical system configured to image a pattern of the reticle onto the substrate;

a substrate stage configured to hold the substrate and to move;

a detector configured to detect a surface position of the substrate, the substrate being held by said substrate stage and moving in the scan direction at a scan speed with said substrate stage, in a direction parallel to an optical axis of said projection optical system over a detection region preset on the substrate; and a controller configured to preset the detection region, to change a detection period over which said detector detects the surface position of the substrate based on a change in a preset value of the scan speed of said substrate stage so that said detector detects the surface position of the substrate over the preset detection region, and to control at least one of a position and a tilt of said substrate stage with respect to the direction parallel to the optical axis, based on the surface position detected by said detector.

2. An apparatus according to claim 1, wherein said controller is configured to preset a plurality of the detection regions on the substrate arranged along the scan direction, and to change the detection period with respect to each of the plurality of the detection regions on the substrate.

3. An apparatus according to claim 1, wherein said detector comprises one of a photoelectric converter, an air micro-sensor and an electrostatic capacitance sensor.

4. An apparatus according to claim 1, wherein said detector comprises a CCD sensor, and said CCD sensor is configured to store charges over the detection period.

5. An apparatus according to claim 4, wherein said detector further comprises a light projecting optical system configured to project light onto the substrate and a light receiving optical system configured to image the projected light on the substrate on said CCD sensor, and said light projecting optical system is configured to adjust an amount of the light in accordance with the detection period.

6. An apparatus according to claim 1, wherein said detector is configured to detect the surface position of the substrate plural times during the detection period to obtain an average of the detected plural surface positions as the surface position of the substrate with respect to the preset detection region.

7. An apparatus according to claim 1, wherein said controller is further configured to obtain an offset for offsetting the surface position of the substrate detected by said detector based on a previous detection of the surface position of the substrate over the preset detection region performed by said detector.

8. A method of manufacturing a device, said method comprising steps of:
exposing a substrate to light directed via a reticle using an exposure apparatus as defined in claim 1;
developing the exposed substrate; and
processing the developed substrate to manufacture the device.

9. An exposure method of exposing a substrates, moving in a scan direction, to light via a reticle, said method comprising steps of:
presetting a detection region on the substrate;
detecting, using a detector, a surface position of the substrate, the substrate being held by a substrate stage and moving in the scan direction at a scan speed with a substrate stage, in a direction parallel to an optical axis of a projection optical system, configured to image a pattern of the reticle on the substrate, over the preset detection region; and
changing a detection period over which the detector detects the surface position of the substrate based on a change in a preset value of the scan speed of the substrate stage so that the detector detects the surface position of the substrate over the preset detection region; and
at least one of positioning and tilting the substrate stage with respect to the direction parallel to the optical axis, based on the surface position detected by the detector.

10. A method according to claim 9, further comprising a step of obtaining an offset for offsetting the surface position of the substrate detected by the detector, based on a previous detection of the surface of the substrate over the preset detection region performed by the detector.

* * * * *